United States Patent
Kobayashi et al.

(10) Patent No.: US 9,517,532 B2
(45) Date of Patent: Dec. 13, 2016

(54) METAL MEMBER, METAL MEMBER SURFACE PROCESSING METHOD, SEMICONDUCTOR DEVICE, SEMICONDUCTOR DEVICE MANUFACTURING METHOD, AND COMPOSITE MOLDED BODY

(71) Applicant: DENSO CORPORATION, Kariya, Aichi-pref. (JP)

(72) Inventors: Wataru Kobayashi, Kariya (JP); Eiji Hayashi, Kariya (JP); Kazuki Kouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/914,061

(22) PCT Filed: Nov. 10, 2014

(86) PCT No.: PCT/JP2014/005625
§ 371 (c)(1),
(2) Date: Feb. 24, 2016

(87) PCT Pub. No.: WO2015/087482
PCT Pub. Date: Jun. 18, 2015

(65) Prior Publication Data
US 2016/0207148 A1 Jul. 21, 2016

(30) Foreign Application Priority Data

Dec. 9, 2013 (JP) .................................. 2013-254302
Jun. 17, 2014 (JP) .................................. 2014-123983
Oct. 15, 2014 (JP) .................................. 2014-210764

(51) Int. Cl.
*H01L 23/00* (2006.01)
*B23K 26/00* (2014.01)
(Continued)

(52) U.S. Cl.
CPC ............. *B23K 26/359* (2015.10); *B23K 26/00* (2013.01); *B23K 26/0081* (2013.01);
(Continued)

(58) Field of Classification Search
None
See application file for complete search history.

(56) References Cited

U.S. PATENT DOCUMENTS 6,087,713 A 7/2000 Haruta
6,593,545 B1 7/2003 Greenwood et al.
(Continued)

FOREIGN PATENT DOCUMENTS

JP 2003-211400 A 7/2003
JP 2004-335776 A 11/2004
(Continued)

OTHER PUBLICATIONS

International Search Report and Written Opinion of the International Searching Authority dated Feb. 10, 2015 issued in the corresponding International application No. PCT/JP2014/005625 (and English translation).

*Primary Examiner* — Jack Chen
(74) *Attorney, Agent, or Firm* — Posz Law Group, PLC

(57) ABSTRACT

An object is to form a rough surface for ensuring adhesion between a metal member and other members, or a rough surface for suppressing solder expansion in the metal member using an energy beam having energy density lower than a related art. A surface processing method of a metal member, in which a metal thin film is arranged on a surface of a base, includes: melting or evaporating a surface portion of the metal thin film by irradiating the metal thin film with a pulse-oscillated laser beam having energy density of 100 J/cm² or less and a pulse width of 1 μs or less; and roughening the surface of the metal thin film by solidifying (Continued)

the surface portion of the metal thin film after the melting or evaporating. The metal thin film is made of at least one of Ni, Au, Pd, and Ag as a main component.

13 Claims, 12 Drawing Sheets

(51) Int. Cl.
    *H01L 23/31* (2006.01)
    *H01L 21/48* (2006.01)
    *H01L 23/495* (2006.01)

(52) U.S. Cl.
    CPC ...... *B23K 26/0084* (2013.01); *H01L 21/4821* (2013.01); *H01L 23/3107* (2013.01); *H01L 23/3142* (2013.01); *H01L 23/49513* (2013.01); *H01L 23/49541* (2013.01); *H01L 23/49548* (2013.01); *H01L 23/49582* (2013.01); *H01L 24/32* (2013.01); *H01L 2224/291* (2013.01); *H01L 2224/2919* (2013.01); *H01L 2224/29139* (2013.01); *H01L 2224/29144* (2013.01); *H01L 2224/29155* (2013.01); *H01L 2224/29164* (2013.01); *H01L 2224/32245* (2013.01); *H01L 2224/83385* (2013.01); *H01L 2224/83439* (2013.01); *H01L 2224/83444* (2013.01); *H01L 2224/83455* (2013.01); *H01L 2224/83464* (2013.01); *H01L 2924/40102* (2013.01)

(56) References Cited

U.S. PATENT DOCUMENTS

| | | | |
|---|---|---|---|
| 7,462,801 | B1 | 12/2008 | Hiramatsu |
| 2003/0052396 | A1 | 3/2003 | Tajima et al. |
| 2004/0222197 | A1 | 11/2004 | Hiramatsu |
| 2005/0263498 | A1 | 12/2005 | Hiramatsu |
| 2006/0138097 | A1 | 6/2006 | Hiramatsu |
| 2006/0138098 | A1 | 6/2006 | Hiramatsu |
| 2009/0023253 | A1 | 1/2009 | Tajima et al. |
| 2009/0277884 | A1 | 11/2009 | Uno et al. |
| 2011/0073577 | A1 | 3/2011 | Tamura et al. |
| 2011/0279929 | A1 | 11/2011 | Kin |
| 2012/0032566 | A1 | 2/2012 | Liu et al. |
| 2013/0078423 | A1 | 3/2013 | Sutou et al. |
| 2014/0305914 | A1 | 10/2014 | Sutou et al. |
| 2016/0207148 | A1* | 7/2016 | Kobayashi .......... H01L 23/3142 |

FOREIGN PATENT DOCUMENTS

| | | |
|---|---|---|
| JP | 2006-007284 A | 1/2006 |
| JP | 2006-303216 A | 11/2006 |
| JP | 2009-255141 A | 11/2009 |
| JP | 2012-233541 A | 11/2012 |
| JP | 2013-111881 A | 6/2013 |
| WO | 2007/072603 A1 | 6/2007 |

* cited by examiner

METAL MEMBER, METAL MEMBER SURFACE PROCESSING METHOD, SEMICONDUCTOR DEVICE, SEMICONDUCTOR DEVICE MANUFACTURING METHOD, AND COMPOSITE MOLDED BODY

CROSS REFERENCE TO RELATED APPLICATIONS

This application is a U.S. national stage application of International Patent Application No. PCT/JP2014/005625 filed on Nov. 10, 2014 and is based on Japanese Patent Applications No. 2013-254302 filed on Dec. 9, 2013, No. 2014-123983 filed on Jun. 17, 2014, and No. 2014-210764 filed on Oct. 15, 2014, the disclosures of which are incorporated herein by reference.

TECHNICAL FIELD

The present disclosure relates to a surface processing method of roughening a surface of a metal member in which a metal thin film is provided on a surface of a base, a metal member having a surface roughened by using the surface processing method, a semiconductor device, a semiconductor device manufacturing method, and a composite molded body.

BACKGROUND

In the related art, a composite molded body in which a metal member and other members (for example, a molded resin member) adhere to each other so as to be integrated has been used in many industries. However, in this type of composite molded body, boundary surfaces of the metal member and the other member, which come into contact with each other, do not adhere to each other and a minute gap is generated by changing a solidification process or an environmental temperature of the other member. Thus, a problem occurs in that ensuring of sufficient adhesion and airtightness is impossible. In order to solve this problem, a technology in which a surface of the metal member is roughened, that is, unevenness is provided in the surface of the metal member, and thus, adhesion between the metal member and the other member is improved has been proposed.

In this type of technology, a technology disclosed in Patent Literature 1 is present as a technology of roughening the surface of the metal member by irradiating the surface of the metal member with an energy beam such as a laser beam. In this technology, irradiation with an energy beam having high energy density causes the surface of the metal member to be melted, and a sputter causes droplets of molten metal to be scattered from the surface of the metal member. Thus, an uneven portion is formed by solidifying the droplets of the molten metal, and thus, a rough surface is formed. Here, in order to cause sputtering to occur in this manner, irradiation with an energy beam having high energy density of, for example, 300 J/cm² or more is required in addition to a material of the metal member. In this technology, a continuously oscillated laser beam is used as the energy beam.

The technology of roughening the surface of the metal member is also used for suppressing expansion of solder in, for example, a composite molded body in which other members (for example, electronic components) are bonded to the surface of the metal member through the solder. In such a composite molded body, a problem that the solder is expanded when other members are pressed on the molten solder which is provided on the surface of the metal member easily occurs, for example, during manufacturing. Thus, the surroundings of a portion of the surface of the metal member, at which the solder is disposed is roughened (unevenness is formed in a surface) and unevenness which is formed through roughening causes expansion of the solder to be blocked. Thus, the expansion of the solder is stopped. In this case, the size (height or width of a convex portion) of the unevenness is set to about several μm such that the unevenness causes the expansion of the solder to be blocked.

The technology in which the surface of the metal member is irradiated with an energy beam such as a laser beam, and thus, the surface of the metal member is roughened is also used when the unevenness is formed in order to suppress expansion of the solder. In this manner, when an unevenness having a large size of about several μm is formed, irradiation with an energy beam having high energy density (for example, 300 J/cm² or more) is required.

In the above-described technology disclosed in Patent Literature 1, droplets of molten metal are necessarily scattered, and the droplets of molten metal may be scattered at a portion other than a portion of the metal member, at which irradiation with an energy beam is performed, or a portion on the outside of the metal member. Thus, various inconveniences may occur. In addition, since an energy beam having high energy density is used, energy consumed by processing is increased.

Particularly, when a configuration in which a metal thin film is provided, and the metal thin film is formed by plating a metal member on a surface of a base, if a surface of the metal thin film is roughened by using the technology disclosed in Patent Literature 1, the applied energy beam has high energy density, and thus, a situation in which the metal thin film is penetrated easily occurs. If the metal thin film is penetrated and the surface of the base is exposed, oxidization of the base and the like, which causes inconvenience, occurs.

PATENT LITERATURE

Patent Literature 1: JP-2013-71312

SUMMARY

It is an object of the present disclosure to provide a surface processing method in which a surface of a metal member having a configuration in which a metal thin film is provided on a surface of a base is roughened by irradiation with an energy beam, with which a rough surface which allows adhesion between the metal member and other members to be ensured, or a rough surface which suppress expansion of solder in the metal member can be formed by using an energy beam which has energy density lower than that in the related art; a metal member whose surface is roughened by the method, a semiconductor device; a semiconductor device manufacturing method, and a composite molded body.

According to a first aspect of the present disclosure, a surface processing method of a metal member in which a metal thin film is arranged on a surface of a base made of a conductive metal material, includes: forming the metal thin film with a material having at least one of Ni, Au, Pd, and Ag as a main component; melting or evaporating a surface portion of the metal thin film by irradiating the surface of the metal thin film with a laser beam which is pulse-oscillated, and has energy density of 100 J/cm² or less and a pulse width equal to or less than 1 μs; and roughening the surface of the metal thin film by solidifying the surface portion of the metal thin film after the melting or evaporating.

According to this surface processing method, a fine unevenness is formed in the surface of the metal member, and thus, adhesion between the metal thin film and other members (molded resin and the like) can be improved. In this method, as in the technology disclosed in Patent Literature 1, since it is unnecessary that droplets of the molten metal are scattered, scattering the droplets of the molten metal, which causes inconvenience, does not occur. In this method, since an energy beam which has low energy density of 100 $J/cm^2$ or less is used, energy consumed by processing can be reduced and a situation occurring by penetrating the metal thin film using the energy beam can hardly occur.

According to a second aspect of the present disclosure, a manufacturing method of a semiconductor device, which includes a lead frame, an IC chip, and a molded resin, wherein: the lead frame has the base, and the metal thin film formed on a surface of the base; the IC chip is mounted on the surface of the metal thin film; the molded resin is formed so as to cover the IC chip and so as to contact with the surface of the metal thin film, includes: roughening a portion of the surface of the metal thin film, which contacts with the molded resin, by the surface processing method of the metal member according to the first aspect.

According to this manufacturing method of a semiconductor device, a fine unevenness is formed in the surface of the metal member, and thus, adhesion between the metal thin film and other members (molded resin and the like) can be improved. In this method, as in the technology disclosed in Patent Literature 1, since it is unnecessary that droplets of the molten metal are scattered, scattering the droplets of the molten metal, which causes inconvenience, does not occur. In this method, since an energy beam which has low energy density of 100 $J/cm^2$ or less is used, energy consumed by processing can be reduced and a situation occurring by penetrating the metal thin film using the energy beam can hardly occur.

According to a third aspect of the present disclosure, a semiconductor device includes: a lead frame which includes a base made of a conductive metal material, and a metal thin film arranged on a surface of the base; an IC chip which is mounted on a surface of the metal thin film; and a molded resin which covers the IC chip and contacts with the surface of the metal thin film. The metal thin film is made of a material which has at least one of Ni, Au, Pd, and Ag as a main component. A groove having a width in a range between 5 μm and 300 μm and extending along a straight line parallel with the surface of the base is arranged at a surface portion of the surface of the metal thin film, which contacts with the molded resin. A plurality of convex portions are arranged around the groove at the surface portion of the metal thin film. A fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

According to this semiconductor device, the fine unevenness is formed on the surface of the metal member, and thus, adhesion between the metal thin film and other members (molded resin and the like) can be improved.

According to a fourth aspect of the present disclosure, a semiconductor device includes: a lead frame which includes a base made of a conductive metal material, and a metal thin film arranged on a surface of the base; an IC chip which is mounted on a surface of the metal thin film; and a molded resin which covers the IC chip and contacts with the surface of the metal thin film. The metal thin film is made of a material which has at least one of Ni, Au, Pd, and Ag as a main component. A groove having a width in a range between 5 μm and 300 μm and extending along a straight line parallel with the surface of the base is arranged at a surface portion of the surface of the metal thin film, which contacts with the molded resin. A plurality of convex portions are arranged in the groove at the surface portion of the metal thin film. A fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

According to this semiconductor device, the fine unevenness is formed on the surface of the metal member, and thus, adhesion between the metal thin film and other members (molded resin and the like) can be improved.

According to a fifth aspect of the present disclosure, a composite molded body includes: a metal member which includes a base made of a conductive metal material, and a metal thin film arranged on a surface of the base; and an electronic component which is bonded to a surface of the metal thin film through a solder. The metal thin film is made of a material which has at least one of Ni, Au, Pd, and Ag as a main component. A laser irradiation groove having a width in a range between 5 μm and 300 μm is arranged at least at a portion of the surface of the metal thin film, which is disposed around a region in which the solder is disposed. A plurality of convex portions are arranged around the groove. A fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

According to this composite molded body, the fine unevenness is formed on the surface of the metal member, and thus, adhesion between the metal thin film and other members (molded resin and the like) can be improved. Since the laser irradiation groove is provided, it is unnecessary that droplets of the molten metal are scattered, and thus, scattering the droplets of the molten metal, which causes inconvenience, does not occur. In addition, energy consumed by processing can be reduced, and a situation where the metal thin film is penetrated by the energy beam can hardly occur.

According to a sixth aspect of the present disclosure, a semiconductor device includes: a lead frame which includes a base made of a conductive metal material, and a metal thin film arranged on a surface of the base; an IC chip which is bonded to a surface of the metal thin film through a solder; and a molded resin which covers the IC chip and contacts with the surface of the metal thin film. The metal thin film is made of a material which has at least one of Ni, Au, Pd, and Ag as a main component. A laser irradiation groove having a width in a range between 5 μm and 300 μm is arranged at a portion of the surface of the metal thin film, which contacts with the molded resin, and is arranged at least at a portion of the surface of the metal thin film, which is disposed around a region in which the solder is disposed. A plurality of convex portions are arranged around the groove. A fine unevenness is arranged to have a size in which an average height of the plurality of convex portions is in a range between 1 nm and 500 nm, an average width of the convex portions is in a range between 1 nm and 300 nm, and an average distance between the convex portions is in a range between 1 nm and 300 nm.

According to this semiconductor device, the fine unevenness is formed on the surface of the metal member, and thus, adhesion between the metal thin film and other members (molded resin and the like) can be improved. Since the laser irradiation groove is provided, it is unnecessary that droplets of the molten metal are scattered, and thus, scattering the droplets of the molten metal, which causes inconvenience, does not occur. In addition, energy consumed by processing can be reduced, and a situation where the metal thin film is penetrated by the energy beam can hardly occur.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, embodiments of the present disclosure will be described with reference to the drawings. In the following embodiments, the same or the equivalent parts will be described with the same reference signs.

First Embodiment

A first embodiment of the present disclosure will be described with reference to FIGS. 1 to 5. In the present embodiment, a semiconductor device 1 will be described as an example of a composite molded body of a metal member and a resin member. The semiconductor device 1 includes a lead frame 2 corresponding to the metal member and a molded resin 4 corresponding to the resin member.

Figure 1:
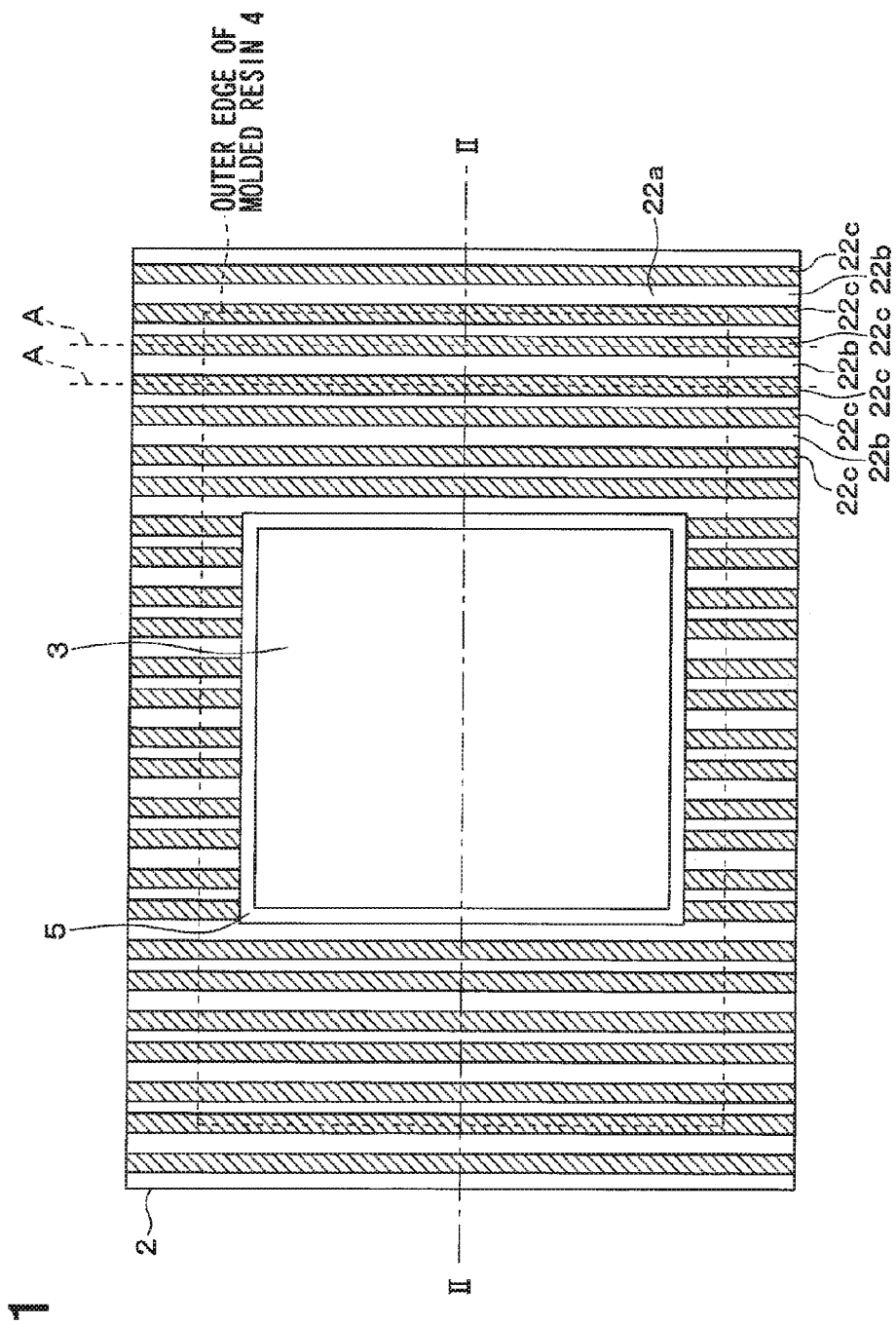
FIG. 1 is a schematic top view schematically illustrating a semiconductor device in a first embodiment of the present disclosure.
Figure 2:
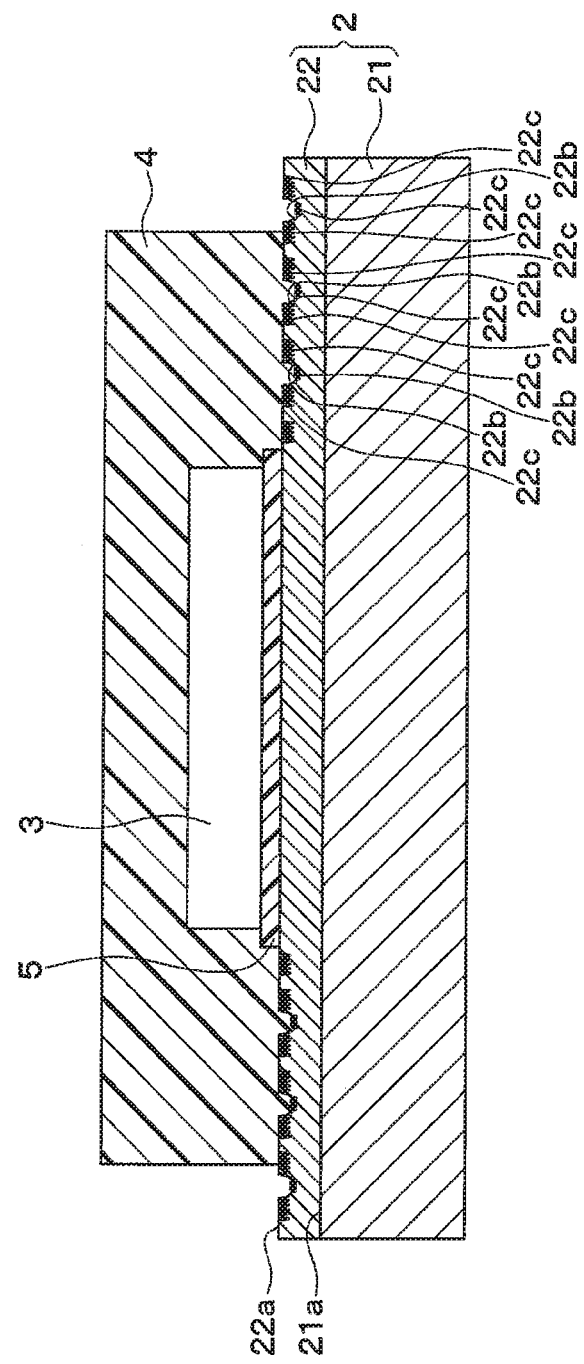
FIG. 2 is a diagram illustrating a cross-section taken along line II-II in FIG. 1.
Figure 3:
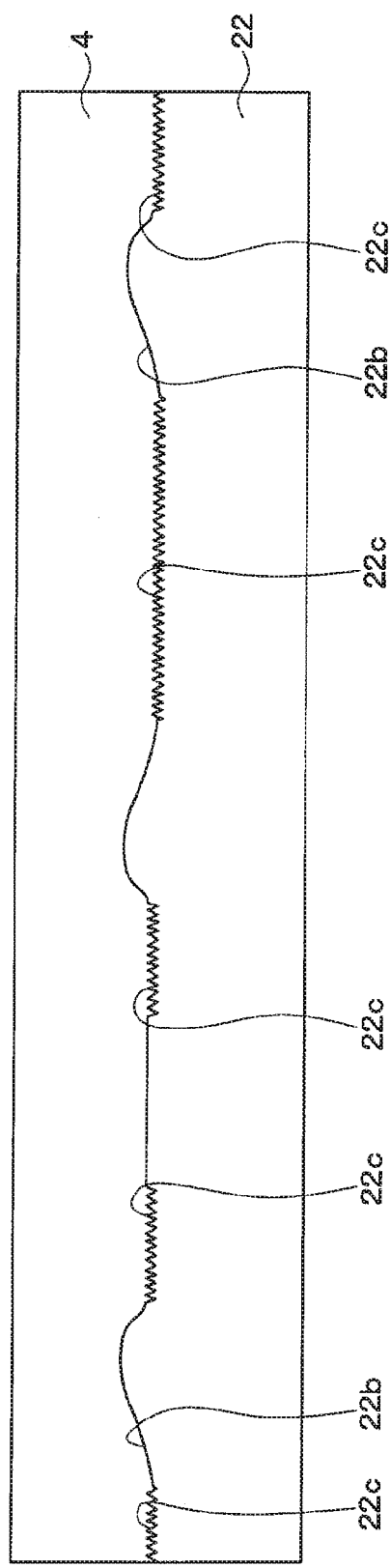
FIG. 3 is a diagram illustrating an enlargement of a section of a portion in the vicinity of a boundary between a surface of a metal thin film and a molded resin in the semiconductor device in the first embodiment of the present disclosure.
Figure 4:
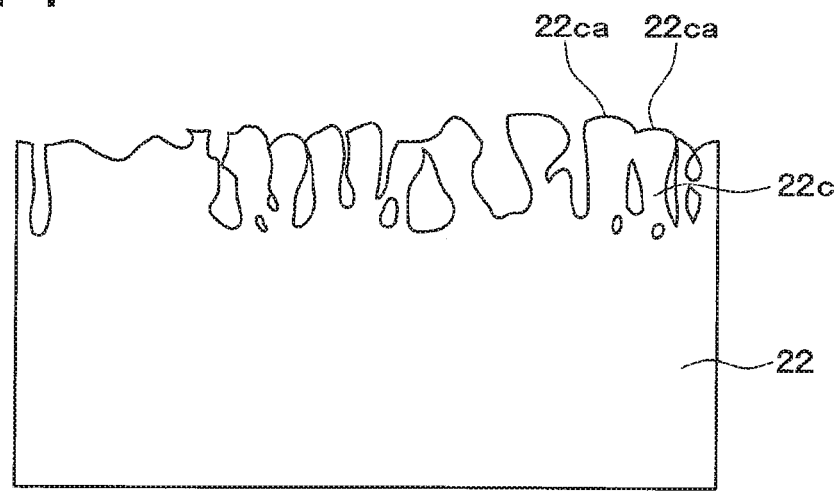
FIG. 4 is a diagram illustrating a shape of a fine unevenness by more enlarging the vicinity of the boundary between the surface of the metal thin film and the molded resin in FIG. 3.

As illustrated in FIGS. 1 and 2, the semiconductor device 1 has a configuration in which an IC chip 3 is mounted on a surface of the lead frame 2, and the IC chip 3 is sealed by the molded resin 4 so as to cover the IC chip 3.

As illustrated in FIG. 2, the lead frame 2 includes a base 21 and a metal thin film 22. The base 21 is formed of a conductive metal material. The metal thin film 22 is plated on a surface 21a of the base 21. As a material of the base 21, for example, any of Cu, Fe, Ni, Pd, Pt, Al, 42 alloy, and iron alloy may be employed. As a material of the metal thin film 22, a material which has at least one of Ni, Au, Pd, and Ag as the main component may be employed. The lead frame 2 is electrically connected to the IC chip 3 through a wiring (not illustrated) and is electrically connected to the outside of the semiconductor device 1 through another wiring (not illustrated).

As illustrated in FIGS. 1 and 2, plural grooves 22b are provided on a surface (surface on an opposite side of a surface facing the surface 21a of the base) 22a of the metal thin film 22. The plural grooves 22b are formed to be extended so as to have a straight line shape when viewed from a direction of a normal line to the surface 21a of the base 21. Each of the grooves 22b is from 5 μm to 300 μm in width (length in a transverse direction of FIG. 2). As illustrated in FIG. 1, the grooves 22b are formed so as to be parallel to each other.

As illustrated in FIG. 2, a fine unevenness (referred to as a fine unevenness below) 22c is formed on the surface 22a of the metal thin film 22, which includes the surroundings of each of the grooves 22b (hatched portion in FIG. 1) and the grooves 22b. The fine unevenness 22c is formed of oxide obtained by oxidizing the material of the metal thin film 22, an alloy of the material of the metal thin film 22 and the material of the base 21, or the like.

As illustrated in FIG. 2, the fine unevenness 22c is formed at a portion of the surface 22a of the metal thin film 22, which comes into contact with the molded resin 4. In the present embodiment, particularly, the fine unevenness 22c is formed along the entirety of the portion of the surface 22a of the metal thin film 22, which comes into contact with the molded resin 4. In the present embodiment, the fine unevenness 22c is not provided at a portion (which will be described later) of the surface 22a of the metal thin film 22, which comes into contact with an IC chip connection member 5, and the fine unevenness 22c is provided only at a portion other than the portion which comes into contact with the IC chip connection member 5.

As illustrated in FIG. 2, in the present embodiment, the IC chip 3 is mounted on the surface 22a of the metal thin film 22 through the IC chip connection member 5. The IC chip connection member 5 is a member for causing the IC chip 3 to adhere to the surface 22a of the metal thin film 22, and is formed by an adhesive, solder, and the like.

The molded resin 4 is provided so as to come into contact with the surface 22a of the metal thin film 22. A material of the molded resin 4 is not particularly limited. However, for example, an epoxy resin, a polyamide resin, a polyphenylene sulfide resin, a thermoplastic resin such as polybutylene terephthalate, a rubber material, and the like may be employed.

Hitherto, the configuration of the semiconductor device 1 according to the present embodiment is described. Next, a surface processing method of forming the above-described fine unevenness 22c on the surface 22a of the metal thin film 22 will be described.

First, as a preparation process, the lead frame 2 which includes the base 21 formed of a conductive metal material and the metal thin film 22 plated on the surface 21a of the base 21, is prepared.

Then, as a melting process, a laser beam which is pulse-oscillated is sequentially applied at different positions on the surface 22a of the metal thin film 22, and thus, the surface 22a of the metal thin film 22 is melted or evaporated. Specifically, a portion of the surface 22a of the metal thin film 22 is melted and evaporated (vaporized) by sequentially irradiating the portion with the laser beam, and thus, the evaporated portion floats in the open air. The laser beam which is pulse-oscillated is adjusted so as to have energy density of 100 J/cm$^2$ or less and a pulse width of 1 μs or less. Here, particularly, the laser beam is set to any of 10 J/cm$^2$, 50 J/cm$^2$, 100 J/cm$^2$ in energy density and is set to any of 10 ns, 200 ns, and 1 μs in pulse width.

At this time, in the present embodiment, beam sources for the above-described laser beam are disposed at different positions on a straight line (reference sign A in FIG. 1) in a vertical direction of FIG. 1, and thus, laser beams are applied at plural positions on the straight line A on the surface 22a of the metal thin film 22. Here, particularly, the beam sources for the laser beam are moved along the straight line A on the surface 22a of the metal thin film 22, and thus, the laser beams are sequentially applied at plural position on the straight line A. For example, the base 21 on which the metal thin film 22 is disposed is placed on an XY table and scanning is performed, or the beam sources side is placed on the XY table and scanning is performed. Thus, the laser beam is sequentially applied to the plural position on the straight line A by moving the beam sources for the laser beam relatively to the base 21. A method of performing a scanning operation by using "galvanoscanner" which scans laser beams by a rotation operation of a mirror, on the beam source side may be employed. The laser beam is applied to the plural positions on the straight line A by using any of the above methods, and thus, the portion of the surface 22a of the metal thin film 22, at which the single groove 22b is formed afterward, is melted. The laser beam is applied onto plural straight lines A by using a similar method and by using the beam sources for the laser beam, such that the plural grooves 22b which are parallel to each other are formed.

Finally, as a solidification process, the portion of the metal thin film 22 which is melted through the melting process is solidified. Specifically, after the portion of the surface 22a of the metal thin film 22, which has been melted and evaporated (vaporized) through the melting process floats in the open air, the floating material is subjected to vapor deposition to a portion (portion functioning as the groove 22b) of the surface 22a of the metal thin film 22, which is irradiated with the laser beam, and to the surroundings of this portion (surroundings of the groove 22b). Thus, the plural grooves 22b which are parallel to each other are formed on the surface 22a of the metal thin film 22 and a material obtained by vaporizing a portion of the surface 22a of the metal thin film 22 is subjected to vapor deposition. Accordingly, the fine unevenness 22c having the above-described size is formed around the groove 22b (at a hatched portion in FIG. 2). The surface of the metal member 2 is roughened and the surface processing method according to the present embodiment is ended by passing through the above processes.

Here, according to a trial manufacturing examination of the inventors, when Cu, Al, and the like which are materials other than the above-described material (material having at least one of Ni, Au, Pd, and Ag as the main component) are used as the material of the metal thin film 22 (other conditions are equivalent), the fine unevenness 22c is not formed. Even when the energy density is not equal to or less than 100 J/cm$^2$, but is set to 150 J/cm$^2$, 300 J/cm$^2$, or the like (other conditions are equivalent), the fine unevenness 22c is not formed. In addition, even when the melting process is performed by applying a laser beam which is continuously oscillated, instead of the laser beam which is pulse-oscillated (other conditions are equivalent), the fine unevenness 22c is not formed. Details of a mechanism relating to a situation in which the fine unevenness 22c is not formed in these cases, but is formed by using the method according to the present disclosure, are not clarified at present. However, if it is considered that a material having a high melting point is not dissipated, but easily stays in place in a melted state even when the laser beam is applied, it is considered that employing a material having a high melting point, for the metal thin film 22 corresponds to a condition for obtaining the fine unevenness 22c according to the present disclosure. It is predicted that the fine unevenness 22c is formed by irradiating the material (Ni, Au, and the like) having a high melting point with a laser beam which has particularly low energy density (for example, 100 J/cm$^2$ or less) and is pulse-oscillated with a particularly short pulse width (for example, 1 μs or less).

Next, the adhesion of the metal member 2 having a surface roughened by the above-described surface processing method, to other members will be described.

Figure 5:
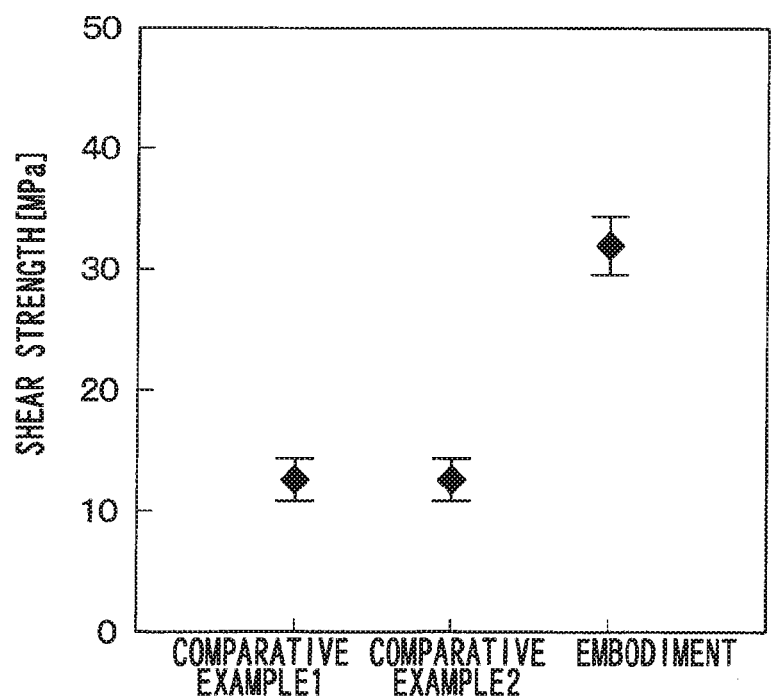
FIG. 5 is a diagram illustrating results obtained by measuring shear strength of a contact surface of the metal thin film and the molded resin in an example according to the first embodiment of the present disclosure, Comparative Example 1, and Comparative Example 2.

As illustrated in FIG. 5, shear strength between the metal member 2 and the molded resin 4 in the semiconductor device 1 according to the present embodiment was measured, and as a result, the shear strength was about 30 [MPa]. Similar measurement was performed in a case (Comparative Example 1 in FIG. 5) where Al was employed as the material of the metal thin film 22 and a case (Comparative Example 2 in FIG. 5) where the melting process was performed by irradiation with a laser beam which is continuously oscillated (these cases are used as comparative examples). As a result, the shear strength was about 10 [MPa] in both of the cases. In this manner, in the present embodiment, the shear strength, that is, the adhesion, which is stronger than that in the comparative examples, can be obtained. Here, it is considered that the main factor is caused by an anchoring effect. In the present embodiment, the anchoring effect occurs by increasing a contact area between the metal thin film 22 and the molded resin 4 by the fine unevenness 22c, and by entwining the molded resin 4 in a convex portion 22ca of the fine unevenness 22c. On the contrary, in Comparative Examples 1 and 2, it is considered that obtaining of high shear strength is impossible because the fine unevenness 22c is not formed.

As described above, the surface 22a of the metal thin film 22 is sequentially irradiated with a laser beam which has energy density of 100 J/cm$^2$ or less, and is pulse-oscillated with a pulse width of 1 μs or less, at different positions. Thus, the surface 22a of the metal thin film 22 is melted. Then, the melted portion of the metal thin film 22 is solidified.

According to the surface processing method, the fine unevenness 22c is formed on the surface 22a of the metal member 2, and thus, the adhesion between the metal thin film 22 and other members (molded resin 4 and the like) can be improved. In this method, as in the technology disclosed in Patent Literature 1, since it is unnecessary that droplets of the molten metal are scattered, scattering the droplets of the molten metal, which causes inconvenience, does not occur. In this method, since an energy beam which has low energy density of 100 J/cm$^2$ or less is used, energy consumed by processing can be reduced and a situation occurring by penetrating the metal thin film 22 using the energy beam can hardly occur.

Second Embodiment

Figure 12:
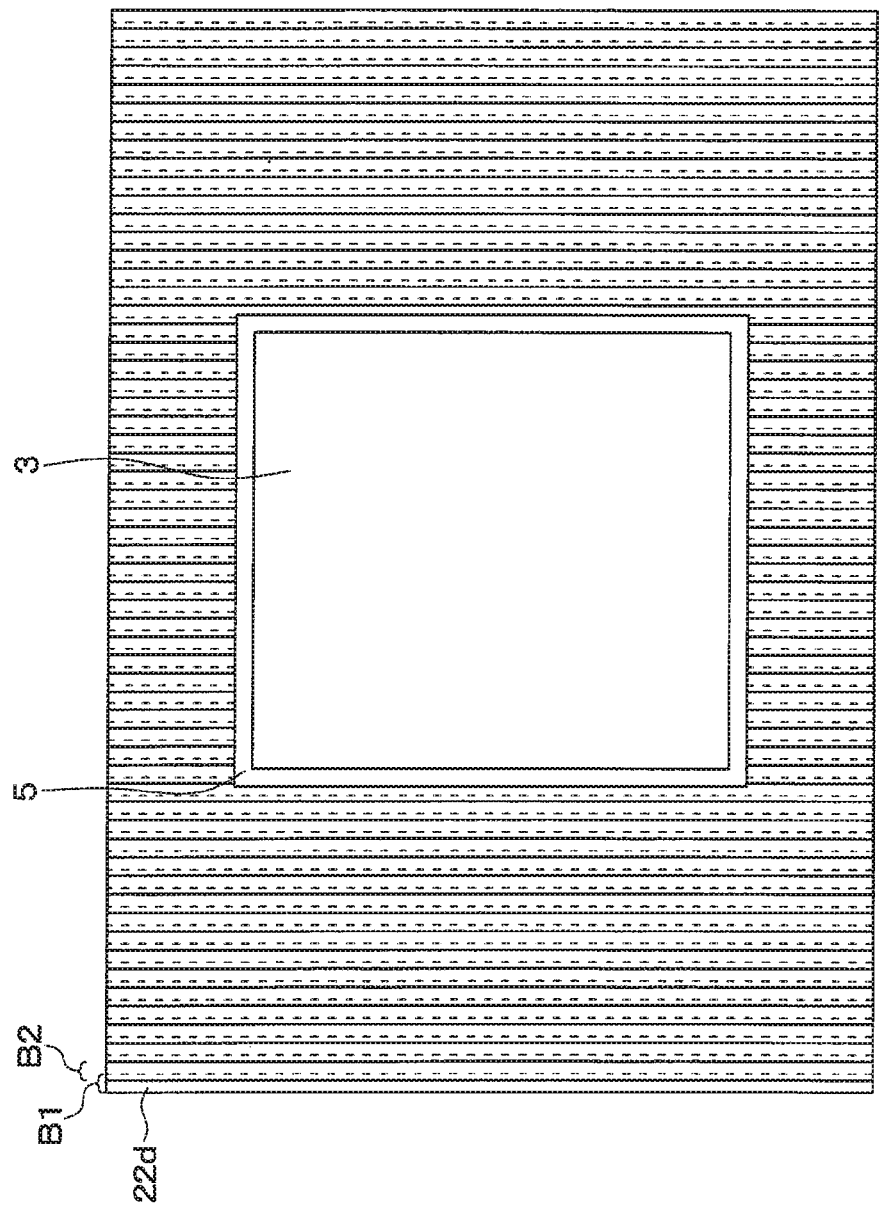
FIG. 12 is a diagram illustrating a semiconductor device in a second embodiment of the present disclosure, corresponding to FIG. 1.
Figure 13:
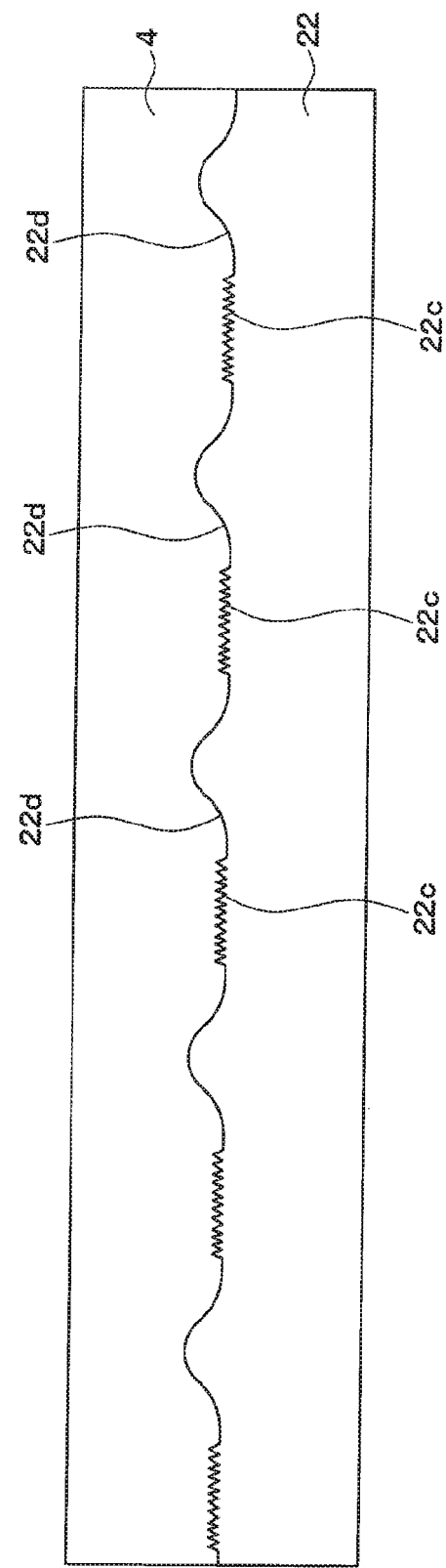
FIG. 13 is a diagram illustrating the semiconductor device in the second embodiment of the present disclosure, corresponding to FIG. 3.

A second embodiment of the present disclosure will be described with reference to FIGS. 12 and 13. In the present embodiment, plural separate grooves 22d are formed instead of plural grooves 22b in comparison to the first embodiment, and other components are similar to those in the first embodiment. Thus, here, descriptions for the similar components will be omitted.

In the first embodiment, the plural grooves 22b are provided in a surface 22a of a metal thin film 22 such that the grooves 22b are parallel to each other and are extended so as to have a straight line shape. In the present embodiment, as illustrated in FIGS. 12 and 13, instead of the plural grooves 22b, the plural grooves 22d are provided.

The groove 22d is formed to be extended so as to have a straight line shape, similar to the groove 22b. Basically, the grooves 22d are formed in the surface 22a of the metal thin film 22 by applying a laser beam onto plural straight lines A, similar to the manufacturing method in the first embodiment. However, the groove 22d in the present embodiment has the following differences from the groove 22b in the first embodiment. That is, as illustrated in FIG. 1, in the first embodiment, the laser beam is applied so as not to come into contact with an irradiation range which is configured by the plural straight lines A (see the reference sign A in FIG. 1), and the irradiation with the laser beam caused the respective grooves 22b of the plural grooves 22b to be formed at positions which are separate from each other. Thus, in the first embodiment, a fine unevenness 22c is formed in the surroundings of each of the grooves 22b (region between the grooves 22b) in addition to being in each of the grooves 22b. However, as illustrated in FIG. 12, in the present embodiment, the grooves 22d are formed by applying the laser beam such that the irradiation range is configured by the respective straight lines of the plural straight lines A being in contact with each other. Here, as an example, the plural grooves 22d having a width narrower than a predetermined width may be formed by repeating a process in which a single groove having the predetermined width (see the reference sign B1 in FIG. 12) is formed by irradiation with a laser beam, and then the adjacent groove having the predetermined width (see the reference sign B2 in FIG. 12) is formed by irradiation with the next laser beam such that a portion of the irradiation range comes into contact with the groove. Thus, as illustrated in FIG. 13, in the present embodiment, the fine unevenness 22c is formed in each of the grooves 22d of the plural grooves 22d. That is, in the present embodiment, the surface 22a of the metal thin film 22 can be roughened by using the fine unevenness 22c which is formed in the groove 22d, not the fine unevenness 22c which is formed around the groove 22d, as the main component.

Here, details of the mechanism are not clarified. However, according to an experiment of the inventors, it is confirmed that the size (average height, average width, and average interval of convex portions 22ca) of the fine unevenness 22c of the portions of the fine unevenness 22c formed in the groove 22b varies smaller than that of the fine unevenness 22c formed around the groove 22b. That is, even when the fine unevenness 22c is formed around the groove 22b, formation of the fine unevenness 22c having a size which satisfies a requirement for stability is more difficult than that in a case of the fine unevenness 22c formed in the groove 22c, and the entirety of the fine unevenness 22c may not be formed. However, in the present embodiment, as described above, the surface 22a of the metal thin film 22 is roughened by using the fine unevenness 22c formed in the groove 22d as the main component, not the fine unevenness 22c formed around the groove 22d. Thus, in the present embodiment, the size of the fine unevenness 22c formed on the surface 22a of the metal thin film 22 can vary slightly, and the adhesion between the metal thin film 22c and other members (for example, molded resin member) can vary slightly, in comparison to the first embodiment.

Other Embodiment

Figure 6:
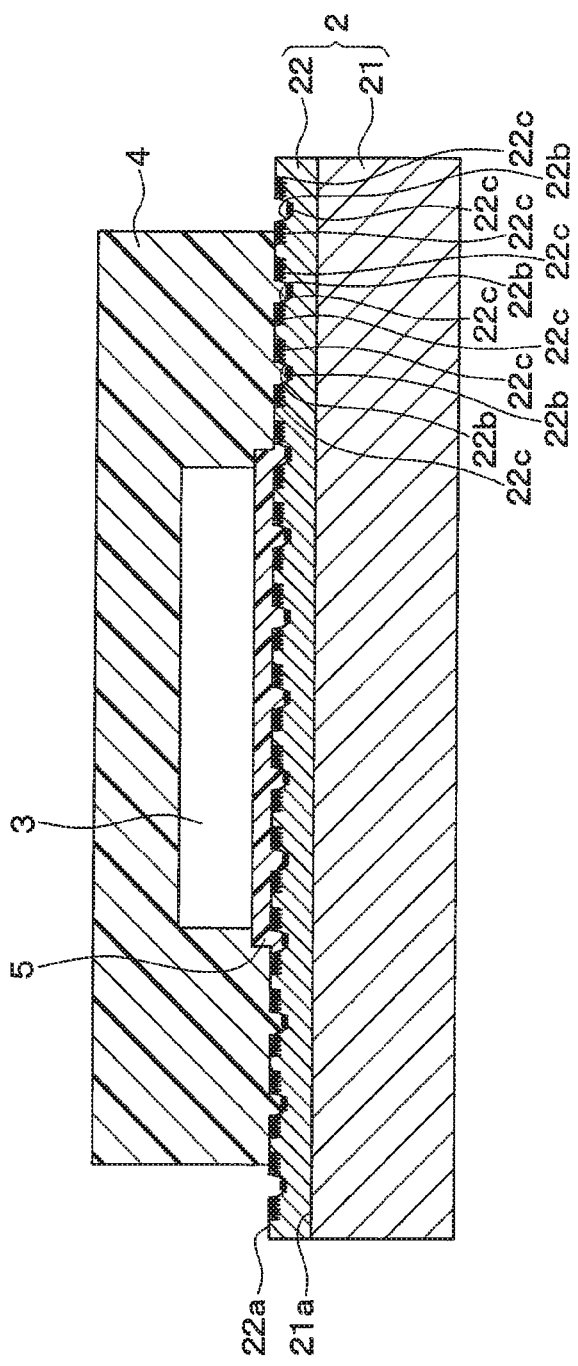
FIG. 6 is a diagram illustrating a semiconductor device in another embodiment of the present disclosure, corresponding to FIG. 2 of the first embodiment.

For example, the first embodiment has a configuration in which a fine unevenness 22c is provided only at a portion other than the portion of a surface 22a of a metal thin film 22, which comes into contact with an IC chip connection member 5. However, as illustrated in FIG. 6, a configuration in which a groove 22b and the fine unevenness 22c may be provided at the portion of the surface 22a of the metal thin film 22, which comes into contact with the IC chip connection member 5 may be made. In this case, the fine unevenness 22c provided at the portion which comes into contact with the IC chip connection member 5 can cause the adhesion between the surface 22a of the metal thin film 22 and the IC chip connection member 5 to be improved.

Figure 7:
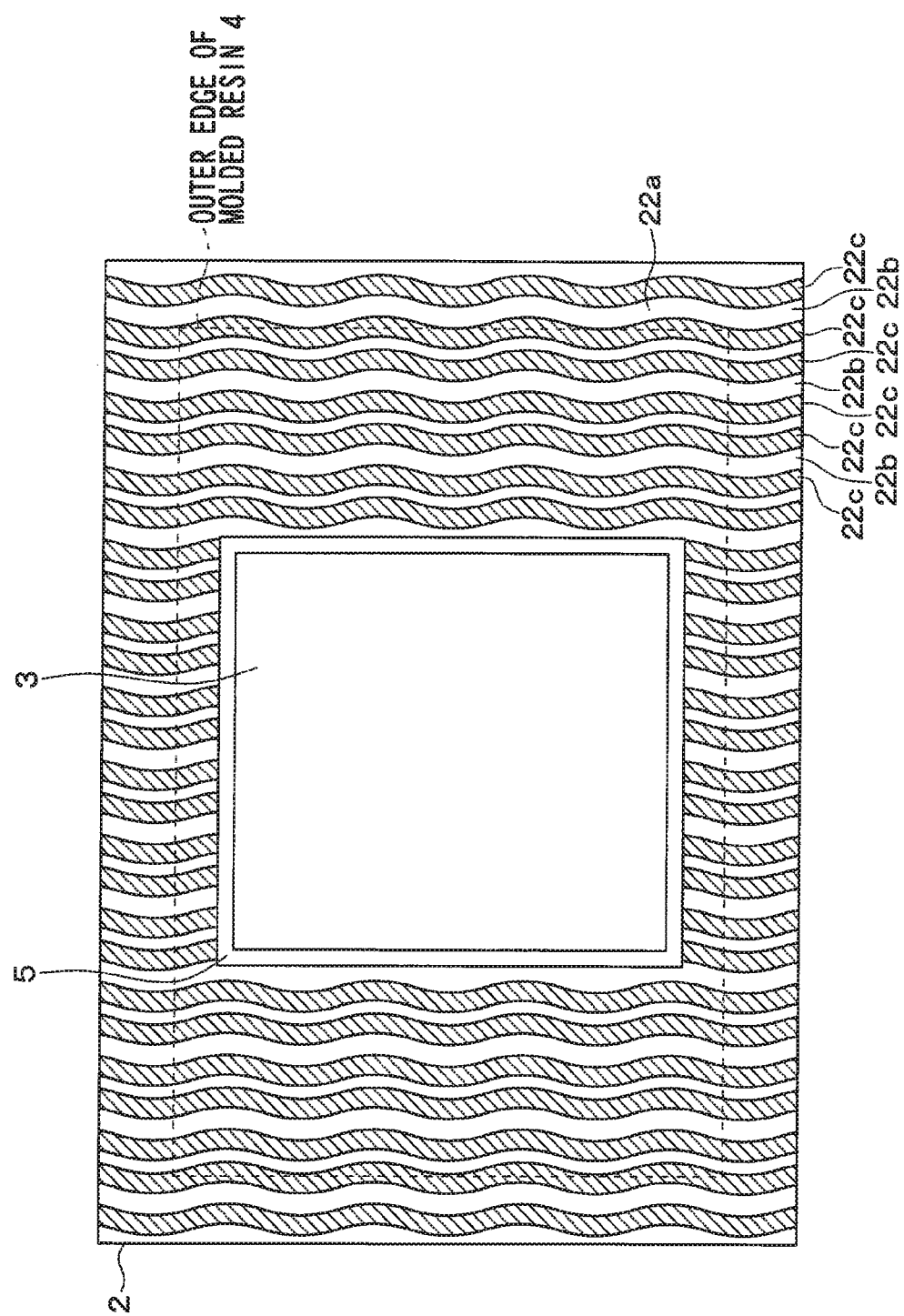
FIG. 7 is a diagram illustrating a semiconductor device in yet another embodiment of the present disclosure, corresponding to FIG. 1 of the first embodiment.
Figure 8:
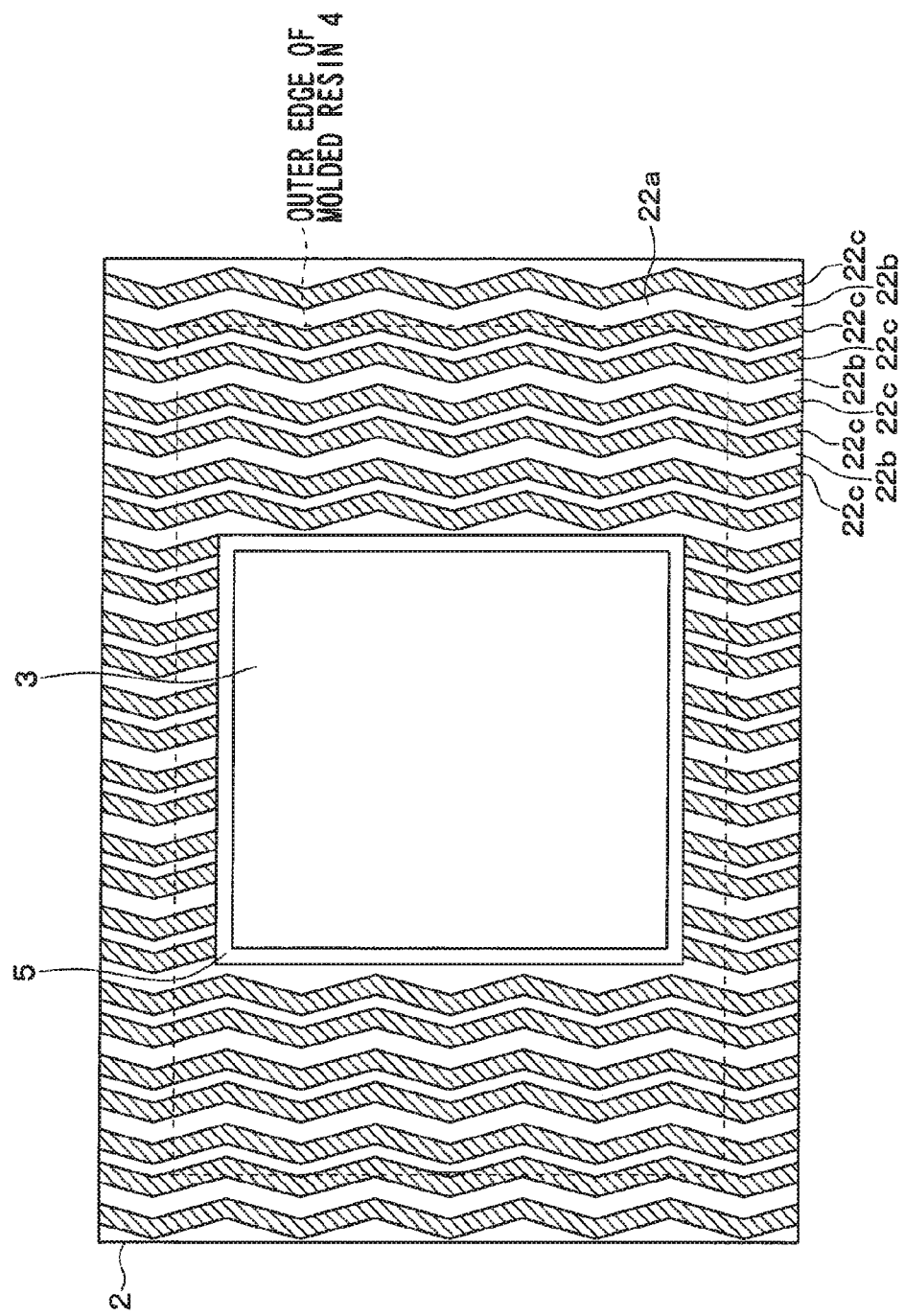
FIG. 8 is a diagram illustrating a semiconductor device in yet another embodiment of the present disclosure, corresponding to FIG. 1 of the first embodiment.
Figure 9:
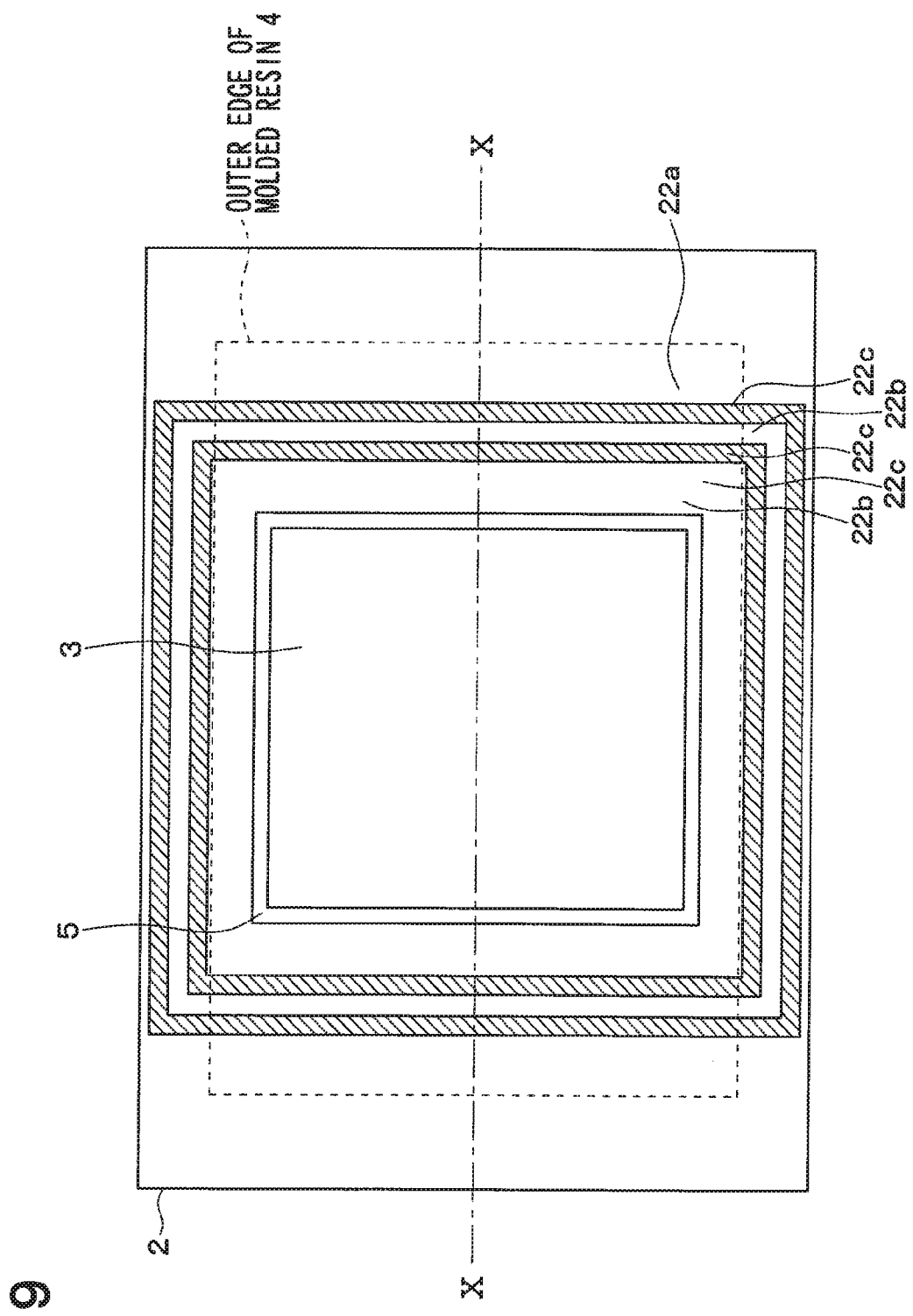
FIG. 9 is a diagram illustrating a semiconductor device in yet another embodiment of the present disclosure, corresponding to FIG. 1 of the first embodiment.
Figure 10:
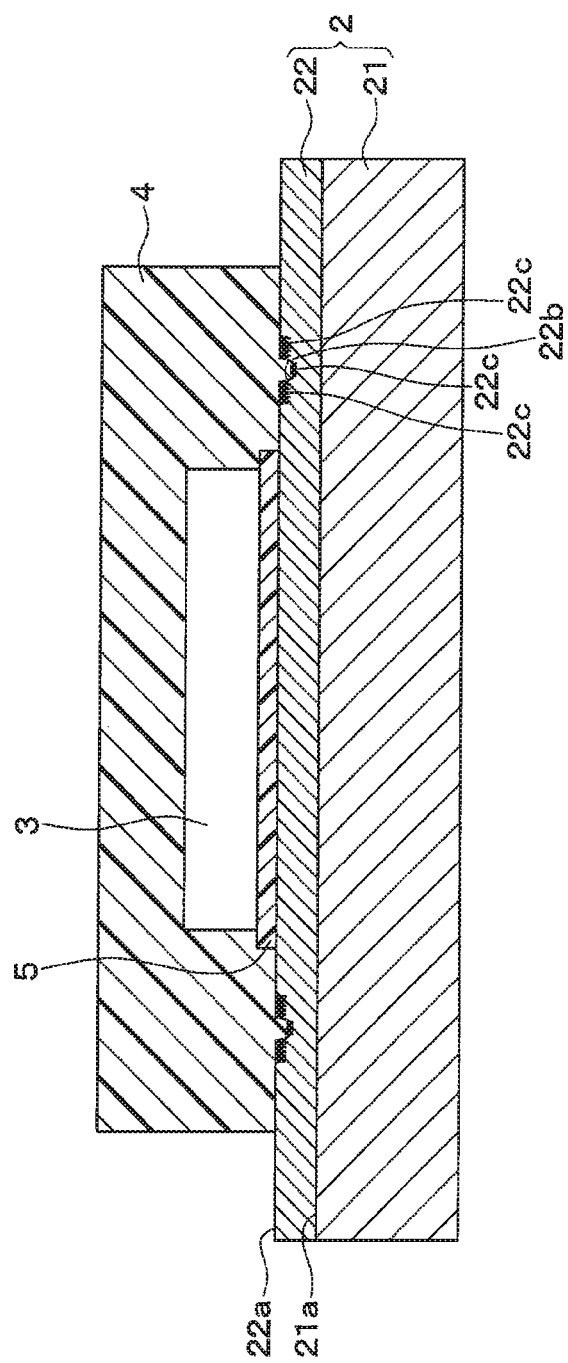
FIG. 10 is a diagram illustrating a section taken along line X-X in FIG. 9.

In the first embodiment, the groove 22b having a straight line shape is formed. However, the form of the groove 22b is not limited to the straight line shape, and the straight line may have other various forms by controlling an irradiation position with a laser beam. For example, as illustrated in FIG. 7, the groove 22b may be formed to be extended so as to have a wave shape. As illustrated in FIG. 8, the groove 22b may be formed to be extended so as to have a crank shape. As illustrated in FIGS. 9 and 10, the groove 22b may be provided so as to surround a portion which is not a contact portion of a metal member 2 and a molded resin 4 (portion at which an IC chip 3 or the IC chip connection member 5 is positioned, when viewed from a direction of a normal line to a surface 21a of a base 21). The number of grooves 22b may be plural.

That is, in the first embodiment, the solder is employed as the IC chip connection member 5. As illustrated in FIGS. 9 and 10, the groove 22b and the fine unevenness 22 may be provided so as to surround a region of the surface 22a of the metal thin film 22, in which the IC chip connection member 5 is positioned. That is, the groove 22b and the fine unevenness 22c may be provided along the entire circumference of the surroundings of the region of the surface 22a of the metal thin film 22, in which the IC chip connection member 5 is disposed. In this case, the groove 22b and the fine unevenness 22c cause expansion of the IC chip connection member 5 to be suppressed.

Here, in the semiconductor device 1, the metal thin film 22 is formed of the material which has at least one of Ni, Au, Pd, and Ag as the main component, that is, a material causing wettability of the IC chip connection member 5 to be low (material causing a contact angle of the IC chip connection member 5 to be large). The fine unevenness 22c having the above size is formed around the groove 22b. Thus, as described below, particularly, the expansion of the IC chip connection member 5 is suppressed at the portion of the surface 22a of the metal thin film 22, at which the fine unevenness 22c is formed.

Figure 11:
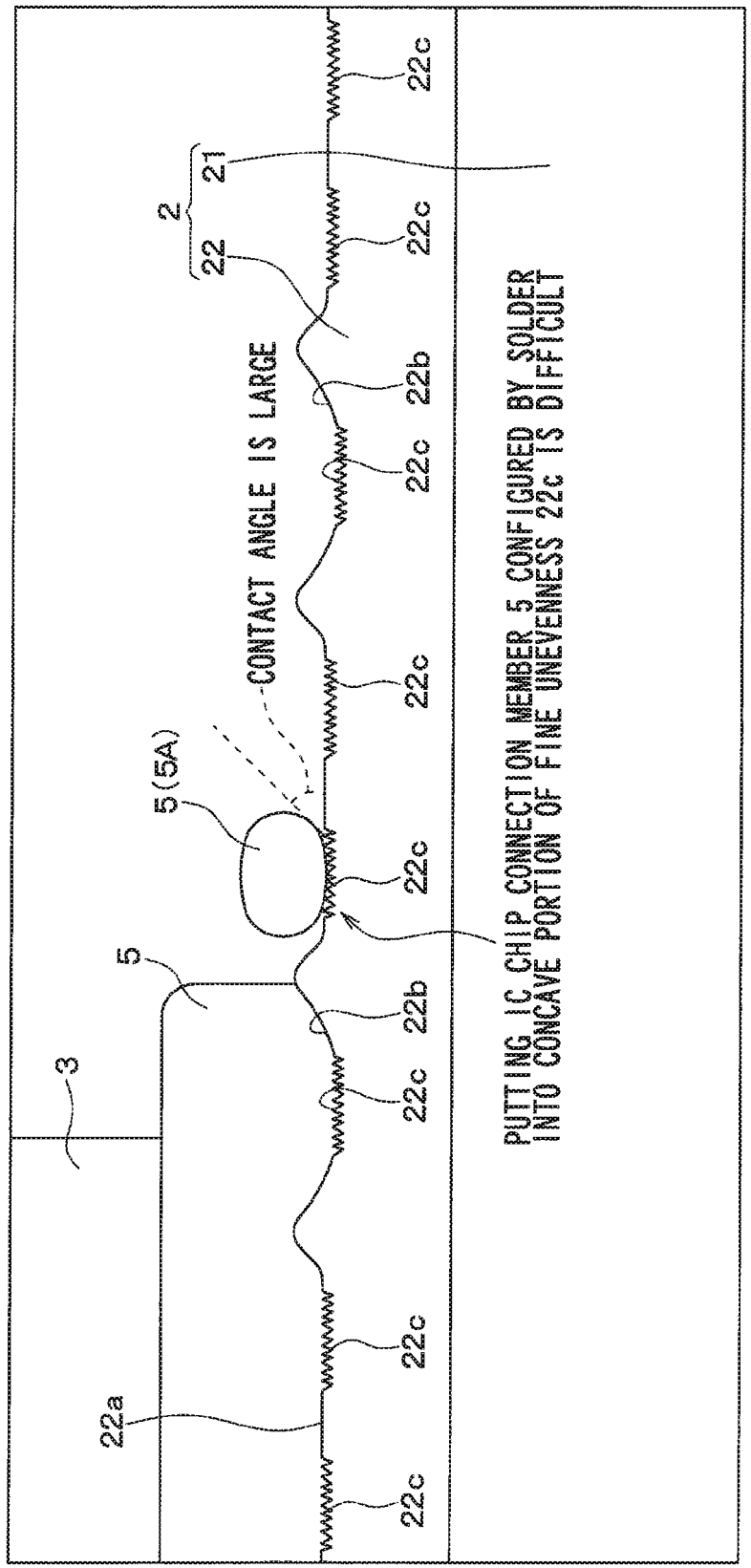
FIG. 11 is a schematic diagram illustrating a state of an IC chip connection member which is moved to a position of the fine unevenness.

That is, as illustrated in FIG. 11, when a portion 5A of the IC chip connection member 5 is moved to the position of the fine unevenness 22c, since the fine unevenness 22c is formed of a material causing the wettability of the IC chip connection member 5 to be low and the size thereof is minute, putting the IC chip connection member 5A into a concave portion of the fine unevenness 22c is difficult. Thus, a contact area of the portion 5A of the IC chip connection member 5 and the surface 22a (fine unevenness 22c) of the metal thin film 22 is reduced. As a result, the portion 5A of the IC chip connection member 5 easily becomes spherical by surface tension and a contact angle of the metal thin film 22 is increased. In this manner, the portion of the surface 22a of the metal thin film 22, at which the fine unevenness 22c is formed is visually in a state where the wettability of the IC chip connection member 5 is low, and thus, the fine unevenness 22c causes the expansion of the IC chip connection member 5 to be particularly suppressed in this semiconductor device 1. In other words, in this semiconductor device 1, the fine unevenness 22c is caused to have a configuration of containing oxide, that is, a configuration of containing a material having high chemical stability, and thus, mixing of the fine unevenness 22c with the constituent material (Sn and the like) of the IC chip connection member 5 is difficult. Thus, in the semiconductor device 1, the expansion of the IC chip connection member 5 is more suppressed.

Here, in the semiconductor device 1, even when the fine unevenness 22c is formed so as to contain a material (for example, nitride) having chemical stability, other than oxide, similar effects are obtained.

Even though the groove 22b and the fine unevenness 22 are not formed along the entire circumference of the surroundings of the region of the surface 22a of the metal thin film 22, in which the IC chip connection member 5 is disposed, if the groove 22b and the fine unevenness 22c are formed at least at a portion of the surroundings of the region, an effect of suppression of the constant expansion of the IC chip connection member 5 is obtained.

Here, the semiconductor device 1 which includes the lead frame 2, the IC chip 3, and the molded resin 4 is described as an example. However, the semiconductor device 1 may have a configuration in which another metal member is included instead of the lead frame 2, or a configuration in which another electronic component is included instead of the IC chip 3. The semiconductor device 1 may have a configuration in which the molded resin 4 is not included. A composite molded body other than the semiconductor device 1 may have a configuration in which the metal member 2 which includes the base 21 which is formed of a conductive metal material and the metal thin film 22, and the electronic component which is bonded to the surface 22a of the metal thin film 22 through the IC chip connection member 5 are included.

In the first embodiment, an example in which the groove 22b is formed as the concave portion is described. However, the concave portion may have a dot shape by applying a laser beam to positions which are separate from each other at an interval which is equal to or greater than a constant interval.

As the material of the metal thin film 22, a preferably employed material is selected among the above-described materials (materials having at least one of Ni, Au, Pd, and Ag as the main component), and has a compound configured by any of Ni, Au, Pd, and Ag and an element having a melting point which is lower than melting points of these elements, as the main component. That is, for example, as the material of the metal thin film 22 in the first embodiment, Ni—P generated through electroless Ni plating is preferably employed (particularly, plating of P5% or more, which is so-called middle-phosphorous, high-phosphorous, or the like is appropriate). In this case, the melting point of the metal thin film 22 is decreased and thus, the metal thin film 22 can be melted and evaporated by using a laser beam which has lower energy, and the fine unevenness 22c can be easily formed.

In the first embodiment, the groove 22b preferably has a depth of 0.5 μm to 5 μm. The depth depends on the constituent material of the metal thin film 22 or the laser beam. The reason of the preferable range of the depth is as follows. That is, if the depth of the groove 22b is less than 0.5 μm, melting and deposition of the surface 22a of the metal thin film 22 by irradiation with the laser beam is insufficient, and sufficient formation of the fine unevenness 22c is difficult. In addition, if the depth of the groove 22b is more than 5 μm, the surface 22a of the metal thin film 22 is easily melted and scattered. Thus, even though vapor deposition is performed, formation of the surface by the melting and scattering is prevalent, and formation of the fine unevenness 22c is difficult.

In the semiconductor device 1 according to the first embodiment, when the metal thin film 22 is formed of Ni, the fine unevenness 22c is formed by using $Ni_2O_3$ as the main component. That is, for example, among components forming the fine unevenness 22c, $Ni_2O_3$ is 80%, NiO is 10%, and Ni is 10%. In this manner, the content of $Ni_2O_3$ having many quantities of the element O is large in the components forming the fine unevenness 22c, and thus, a hydrogen bond or a covalent bond easily occurs between the metal thin film 22 and other members, and adhesive force between the metal thin film 22 and other members is easily improved.

In the semiconductor device 1 according to the first embodiment, a convex portion 22ca having an aspect ratio (ratio of the height and the width of the convex portion 22ca) which is equal to or greater than 1:2, or the convex portion 22ca extended in a direction which is inclined at an angle of being within 45° to the surface 22a of the metal thin film 22 is formed among at least some of the plural convex portions 22ca constituting the fine unevenness 22c. Thus, in the semiconductor device 1 according to the first embodiment, another member (for example, molded resin member) is easily bitten between the surface 22a of the metal thin film 22 and the fine unevenness 22c, and the adhesion between the metal thin film 22 and other members (for example, molded resin member) is easily ensured.

In the semiconductor device 1 according to the first embodiment, an oxide film is formed at a portion in the vicinity of the surface 22a of the metal thin film 22 (in FIG. 2, the surface 22a of the metal thin film 22 and a portion of the metal thin film 22 on a lower side of the surface 22a). The oxide film is formed along the entirety of the metal thin film 22 when viewed from the direction of the normal line to the surface 22a. Thus, the semiconductor device 1 can have excellent corrosion-resistance, and damage of the adhesion between the metal thin film 22 and other members under a corrosive environment can be unlikely to occur.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A surface processing method of a metal member in which a metal thin film is arranged on a surface of a base made of a conductive metal material, the surface processing method comprising:
   forming the metal thin film with a material having at least one of Ni, Au, Pd, and Ag as a main component;
   melting or evaporating a surface portion of the metal thin film by irradiating the surface of the metal thin film with a laser beam which is pulse-oscillated, and has energy density of 100 J/cm$^2$ or less and a pulse width equal to or less than 1 μs; and
   roughening the surface of the metal thin film by solidifying the surface portion of the metal thin film after the melting or evaporating.

2. The surface processing method of the metal member according to claim 1, wherein:
   the melting or evaporating includes:
      arranging a plurality of beam sources of the laser beam along a direction of a plurality of normal lines to the surface of the metal thin film, the normal lines respectively passing through a plurality of different positions on at least one straight line, which is parallel with the surface of the metal thin film; and
      irradiating the laser beam on the plurality of different positions on the at least one straight line on the surface of the metal thin film.

3. The surface processing method of the metal member according to claim 2, wherein:
   the melting or evaporating further includes:
      moving the beam sources of the laser beam along the straight line; and
      sequentially irradiating the laser beam on the plurality of different positions on the straight line.

4. The surface processing method of a metal member according to claim 2, wherein:
   the at least one straight line includes a plurality of straight lines; and
   the melting or evaporating further includes:
      forming a groove by irradiating the laser beam so as to contact with an irradiation range, which is formed along each straight line.

5. The surface processing method of the metal member according to claim 2, wherein:
   the at least one straight line includes a plurality of straight lines; and
   the plurality of straight lines are parallel with each other.

6. A manufacturing method of a semiconductor device, which includes a lead frame, an IC chip, and a molded resin, wherein: the lead frame has the base, and the metal thin film formed on a surface of the base; the IC chip is mounted on the surface of the metal thin film; the molded resin is formed so as to cover the IC chip and so as to contact with the surface of the metal thin film, the manufacturing method of the semiconductor device comprising:
   roughening a portion of the surface of the metal thin film, which contacts with the molded resin, by the surface processing method of the metal member according to claim 1.

7. A semiconductor device comprising:
   a lead frame which includes a base made of a conductive metal material, and a metal thin film arranged on a surface of the base;
   an IC chip which is mounted on a surface of the metal thin film; and
   a molded resin which covers the IC chip and contacts with the surface of the metal thin film, wherein:
   the metal thin film is made of a material which has at least one of Ni, Au, Pd, and Ag as a main component;
   a groove having a width in a range between 5 μm and 300 μm and extending along a straight line parallel with the surface of the base is arranged at a surface portion of the surface of the metal thin film, which contacts with the molded resin;
   a plurality of convex portions are arranged around the groove at the surface portion of the metal thin film; and
   a fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

8. The semiconductor device according to claim 7, wherein:
   the fine unevenness is made of oxide obtained by oxidizing the material of the metal thin film, or is made of an alloy of the material of the metal thin film and a material of the base.

9. A semiconductor device comprising:
   a lead frame which includes a base made of a conductive metal material, and a metal thin film arranged on a surface of the base;
   an IC chip which is mounted on a surface of the metal thin film; and
   a molded resin which covers the IC chip and contacts with the surface of the metal thin film, wherein:
   the metal thin film is made of a material which has at least one of Ni, Au, Pd, and Ag as a main component;
   a groove having a width in a range between 5 μm and 300 μm and extending along a straight line parallel with the surface of the base is arranged at a surface portion of the surface of the metal thin film, which contacts with the molded resin;
   a plurality of convex portions are arranged in the groove at the surface portion of the metal thin film; and
   a fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

10. A composite molded body comprising:
    a metal member which includes a base made of a conductive metal material, and a metal thin film arranged on a surface of the base; and
    an electronic component which is bonded to a surface of the metal thin film through a solder, wherein:
    the metal thin film is made of a material which has at least one of Ni, Au, Pd, and Ag as a main component;
    a laser irradiation groove having a width in a range between 5 μm and 300 μm is arranged at least at a portion of the surface of the metal thin film, which is disposed around a region in which the solder is disposed;

a plurality of convex portions are arranged around the groove; and a fine unevenness is arranged to have a size, in which an average height of the convex portions is in a range between 1 nm and 500 nm, an average width of the convex portions is in a range between 1 nm and 300 nm, and an average distance between the convex portions is in a range between 1 nm and 300 nm.

11. The composite molded body according to claim 10, wherein:

the groove and the fine unevenness are arranged along an entire circumference of a surrounding of a region of the surface of the metal thin film, in which the solder is disposed.

12. A semiconductor device comprising:

a lead frame which includes a base made of a conductive metal material, and a metal thin film arranged on a surface of the base;

an IC chip which is bonded to a surfaced of the metal thin film through a solder; and a molded resin which covers the IC chip and contacts with the surface of the metal thin film, wherein:

the metal thin film is made of a material which has at least one of Ni, Au, Pd, and Ag as a main component;

a laser irradiation groove having a width in a range between 5 μm and 300 μm is arranged at a portion of the surface of the metal thin film, which contacts with the molded resin, and is arranged at least at a portion of the surface of the metal thin film, which is disposed around a region in which the solder is disposed;

a plurality of convex portions are arranged around the groove; and a fine unevenness is arranged to have a size in which an average height of the plurality of convex portions is in a range between 1 nm and 500 nm, an average width of the convex portions is in a range between 1 nm and 300 nm, and an average distance between the convex portions is in a range between 1 nm and 300 nm.

13. The semiconductor device according to claim 12, wherein:

the groove and the fine unevenness are arranged along an entire circumference of a surrounding of a region of the surface of the metal thin film, in which the solder is disposed.

* * * * *